United States Patent
Liu

(10) Patent No.: US 11,946,699 B2
(45) Date of Patent: Apr. 2, 2024

(54) BENDABLE VAPOR CHAMBER STRUCTURE

(71) Applicant: ASIA VITAL COMPONENTS (SHEN ZHEN) CO., LTD., Shenzhen (CN)

(72) Inventor: Han-Min Liu, Shenzhen (CN)

(73) Assignee: ASIA VITAL COMPONENTS (SHEN ZHEN) CO., LTD., Shenzhen (CN)

( * ) Notice: Subject to any disclaimer, the term of this patent is extended or adjusted under 35 U.S.C. 154(b) by 374 days.

(21) Appl. No.: 16/824,679

(22) Filed: Mar. 19, 2020

(65) Prior Publication Data

US 2021/0293485 A1 Sep. 23, 2021

(51) Int. Cl.
*F28D 15/04* (2006.01)
*F28D 15/02* (2006.01)

(52) U.S. Cl.
CPC ....... *F28D 15/0241* (2013.01); *F28D 15/043* (2013.01)

(58) Field of Classification Search
CPC .............. F28D 15/0241; F28D 15/043; F28D 15/0233; F28D 15/046; F28D 15/04; F28F 21/06; F28F 21/08; H01L 23/427
See application file for complete search history.

(56) References Cited

U.S. PATENT DOCUMENTS

| | | | | |
|---|---|---|---|---|
| 9,889,951 | B1 * | 2/2018 | Wong | F28D 15/0275 |
| 2015/0289413 | A1 * | 10/2015 | Rush | B22F 10/20 |
| | | | | 165/53 |
| 2017/0122672 | A1 * | 5/2017 | Lin | B23K 35/00 |

FOREIGN PATENT DOCUMENTS

| | | | | |
|---|---|---|---|---|
| CN | 108225074 | A | 6/2018 | |
| CN | 207703057 | U * | 8/2018 | ........... F28D 15/046 |
| JP | 2007147226 | A * | 6/2007 | ......... F28D 15/0241 |
| TW | M417531 | | 12/2011 | |
| TW | M493032 | | 1/2015 | |
| TW | 201617577 | A | 5/2016 | |
| TW | I541486 | | 7/2016 | |
| TW | M615244 | | 5/2021 | |

OTHER PUBLICATIONS

Search Report dated Nov. 12, 2021 issued by Taiwan Intellectual Property Office for counterpart application No. 110114747.
Search Report dated Mar. 15, 2023 issued by Taiwan Intellectual Property Office for counterpart application No. 109103220.

* cited by examiner

*Primary Examiner* — Harry E Arant
(74) *Attorney, Agent, or Firm* — Demian K. Jackson; Jackson IPG PLLC

(57) ABSTRACT

A bendable vapor chamber structure includes a first plate body and a second plate body assembly. The first plate body has a first face and a second face on upper and lower sides. The second plate body assembly has multiple plate bodies and at least one bendable connection body. The bendable connection body is disposed between the plate bodies and connected with the plate bodies. The second plate body assembly is correspondingly mated with the first plate body to together define a receiving space. A first capillary structure is disposed in the receiving space. A working liquid is filled in the receiving space. By means of the bendable connection body, the vapor chamber is bendable.

20 Claims, 16 Drawing Sheets

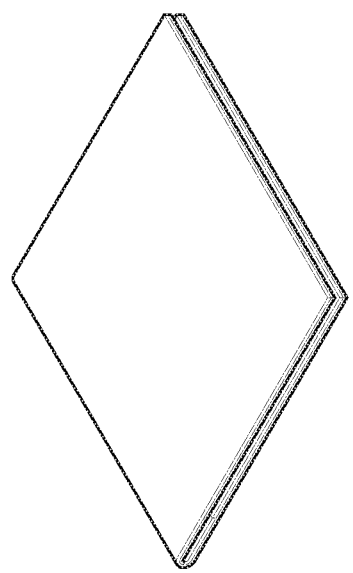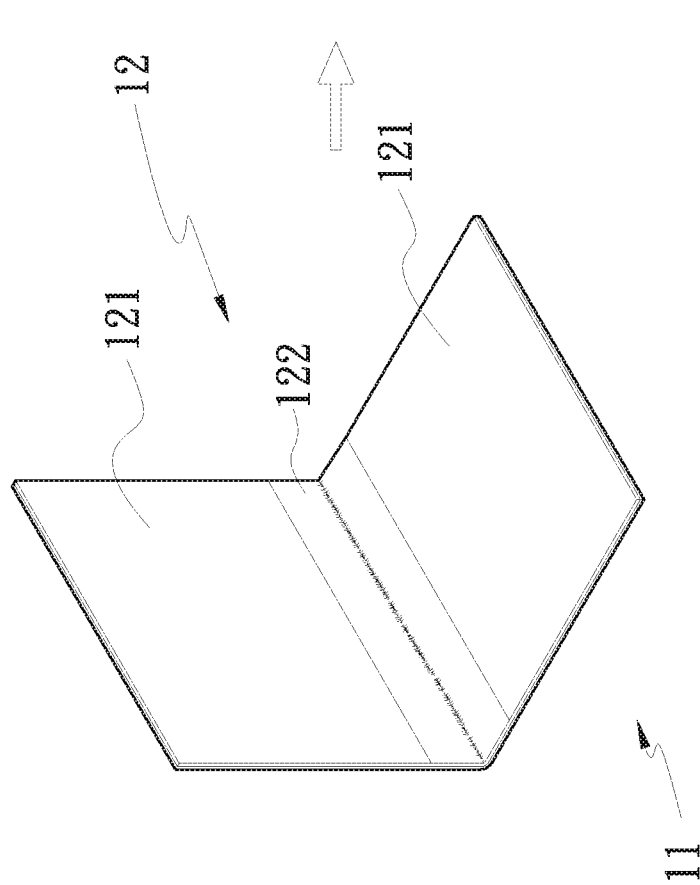
Fig. 15

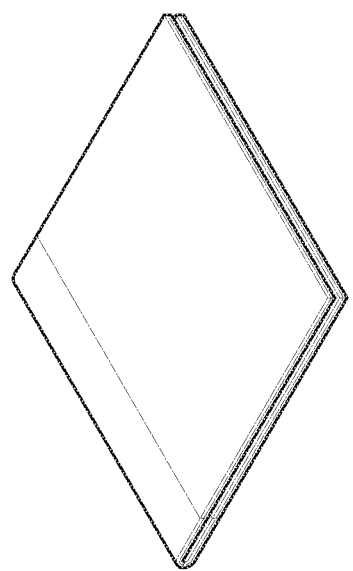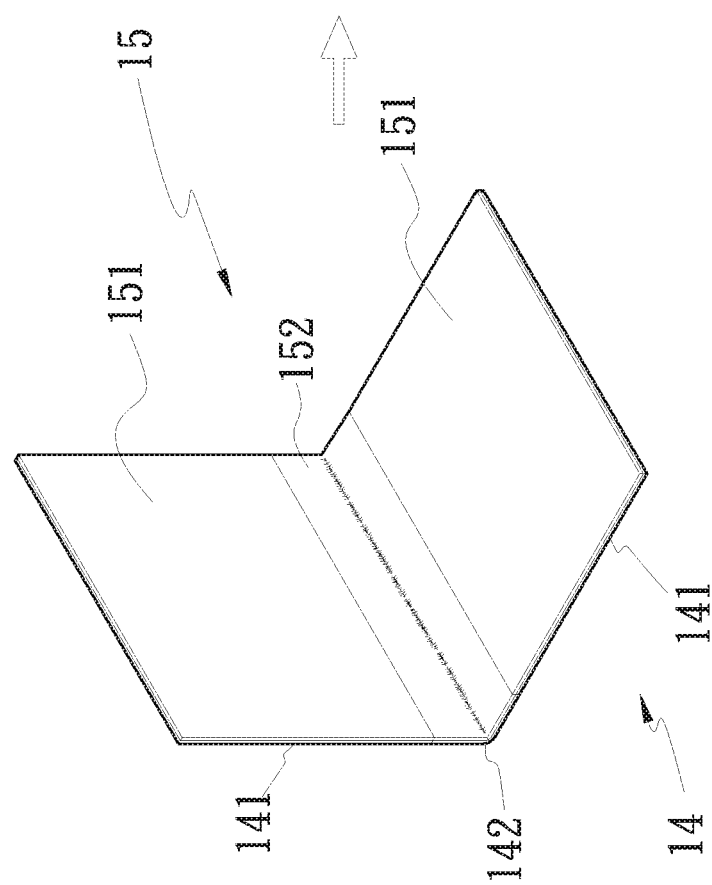
Fig. 16

BENDABLE VAPOR CHAMBER STRUCTURE

BACKGROUND OF THE INVENTION

1. Field of the Invention

The present invention relates generally to a bendable vapor chamber structure, and more particularly to a bendable vapor chamber structure, which can be bent and folded onto itself.

2. Description of the Related Art

Currently, the handheld devices are gradually developed to have higher and higher performance. As a result, the heat generated by the internal electronic components of the handheld devices has become higher and higher. In addition, there is a trend to develop the handheld devices or mobile devices with large-scale touch screen or operation interface. Therefore, it is inconvenient for a user to carry the handheld devices or mobile devices with him/her.

Therefore, it is a primary problem for those who are skilled in this field to solve that the heat generated by the internal electronic components of the handheld devices must be dissipated. Accordingly, a great amount of heat conduction components such as thin heat pipes or thin vapor chambers are used in the handheld devices to quickly conduct the heat generated by the internal electronic components to a remote end to dissipate the heat.

Moreover, in order to solve the problem of the large-scale handheld devices or mobile devices that it is inconvenient to carry the handheld devices or mobile devices, there is a trend for those who are skilled in this field to employ a hinge or rotary shaft, which enables a user to fold or unfold the handheld devices or mobile devices so as to minify the volume of the handheld devices or mobile devices and solve the problem that it is inconvenient to carry the handheld devices or mobile devices. The screen and other components can be bent to minify the volume. However, the problem that the heat conduction components (thin vapor chambers and thin heat pipes) cannot be bent is still not solved. After thinned, the thin vapor chambers and thin heat pipes can be bent. However, the bending curvature of the thin vapor chambers and thin heat pipes cannot be too large so that the thin vapor chambers and thin heat pipes cannot be 90-degree folded. Otherwise, the thin vapor chambers and thin heat pipes will be broken or damaged to lead to leakage of the working liquid and lose the degree of vacuum of the interior or the detachment of the capillary structures to lose the capillarity. It is therefore tried by the applicant to provide a bendable vapor chamber structure to solve the shortcomings and problems existing in the conventional vapor chamber structure.

SUMMARY OF THE INVENTION

It is therefore a primary object of the present invention to provide a bendable vapor chamber structure, which is applicable to a handheld device to enable a user to fold and unfold the handheld device without damaging the main body structure of the vapor chamber so that the vapor chamber can still normal work to conduct the heat.

To achieve the above and other objects, the bendable vapor chamber structure of the present invention includes a first plate body and a second plate body assembly.

The first plate body has a first face and a second face on upper and lower sides.

The second plate body assembly has multiple plate bodies and at least one first bendable connection body. The first bendable connection body is disposed between the plate bodies and connected with the plate bodies. The second plate body assembly is correspondingly mated with the first plate body to together define a receiving space. A first capillary structure is disposed in the receiving space. A working liquid is filled in the receiving space.

Still to achieve the above and other objects, the bendable vapor chamber structure of the present invention includes a first plate body assembly and a second plate body assembly.

The first plate body assembly has multiple first plate bodies and at least one first bendable connection body. The first plate bodies are connected by means of the first bendable connection body.

The second plate body assembly has multiple second plate bodies and at least one second bendable connection body. The second plate bodies are connected by means of the second bendable connection body. The second plate body assembly is correspondingly mated with the first plate body assembly to together define a receiving space. A first capillary structure is disposed in the receiving space. A working liquid is filled in the receiving space.

The bendable vapor chamber structure of the present invention can solve the problem of the conventional vapor chamber that the vapor chamber cannot be bent or horizontally folded onto itself or unfolded.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 15 is a perspective view showing the operation of the bendable vapor chamber structure of the present invention; and FIG. 16 is a perspective view showing the operation of the bendable vapor chamber structure of the present invention.

DETAILED DESCRIPTION OF THE PREFERRED EMBODIMENTS

Figure 1:
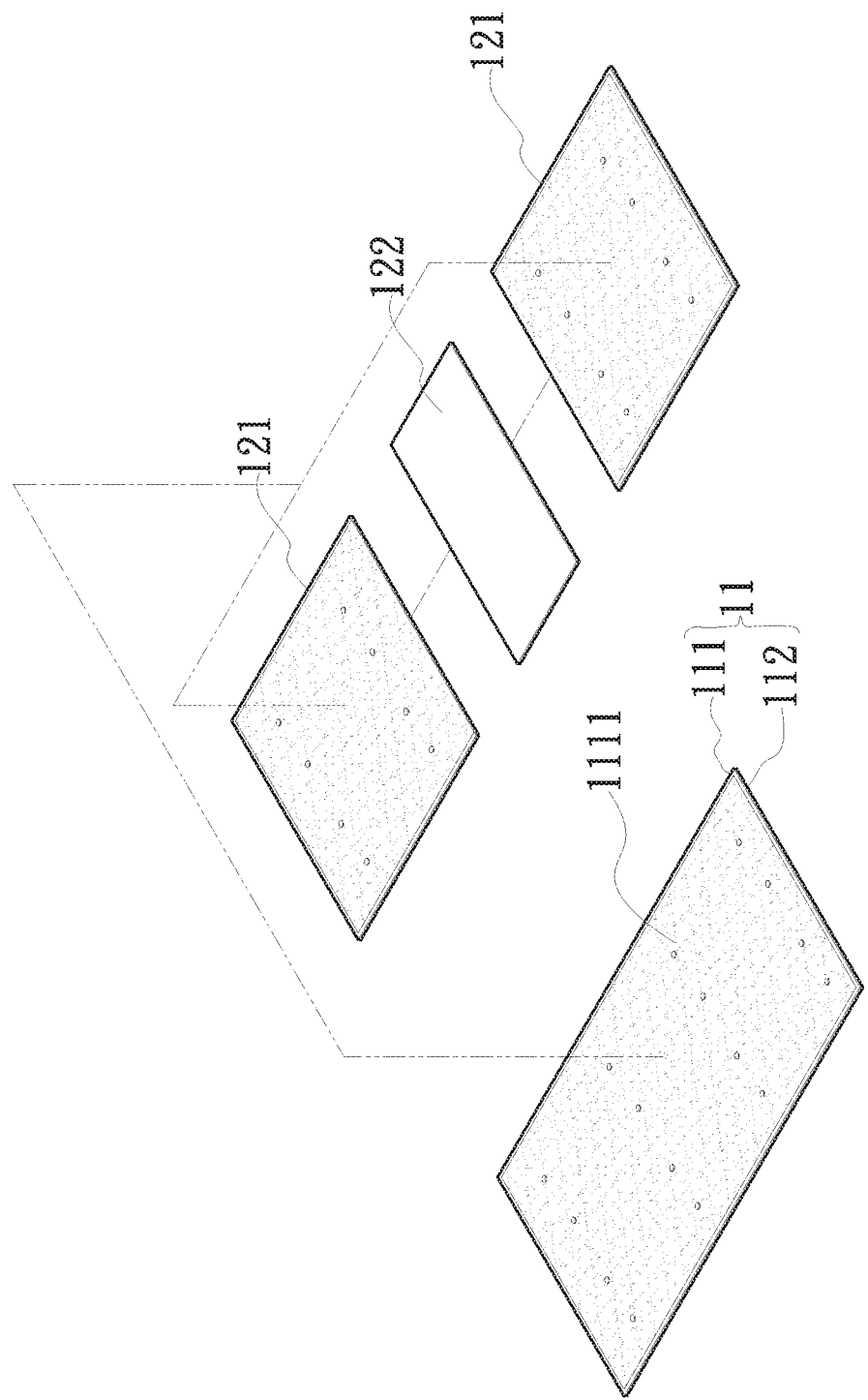
FIG. 1 is a perspective exploded view of a first embodiment of the bendable vapor chamber structure of the present invention.
Figure 2:
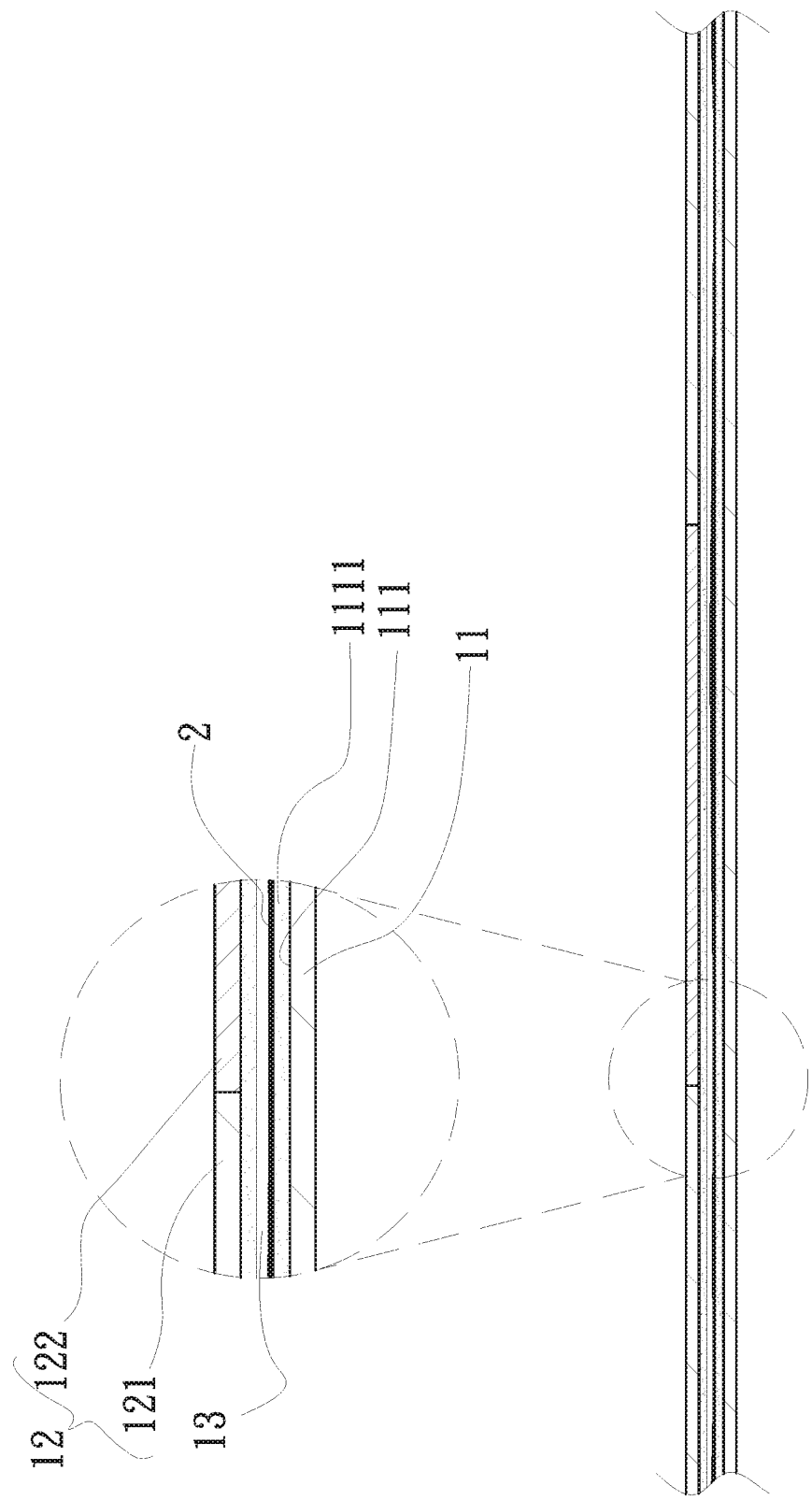
FIG. 2 is a sectional assembled view of the first embodiment of the bendable vapor chamber structure of the present invention.

Please refer to FIGS. 1 and 2. FIG. 1 is a perspective exploded view of a first embodiment of the bendable vapor chamber structure of the present invention. FIG. 2 is a sectional assembled view of the first embodiment of the bendable vapor chamber structure of the present invention. According to the first embodiment, the bendable vapor chamber structure of the present invention includes a first plate body 11 and a second plate body assembly 12.

The first plate body 11 has a first face 111 and a second face 112 on upper and lower sides.

The second plate body assembly 12 has multiple plate bodies 121 and a first bendable connection body 122. The first bendable connection body 122 is disposed between the plate bodies 121 and horizontally mated and connected with the plate bodies 121. The second plate body assembly 12 is correspondingly mated with the first plate body 11 to together define a receiving space 13. A first capillary structure 1111 is disposed in the receiving space 13. The first capillary structure 1111 is selectively disposed on the surface of the first plate body 11 or the surface of the second plate body assembly 12 or disposed between the first plate body 11 and the second plate body assembly 12. A working liquid 2 is filled in the receiving space 13.

Figure 3:
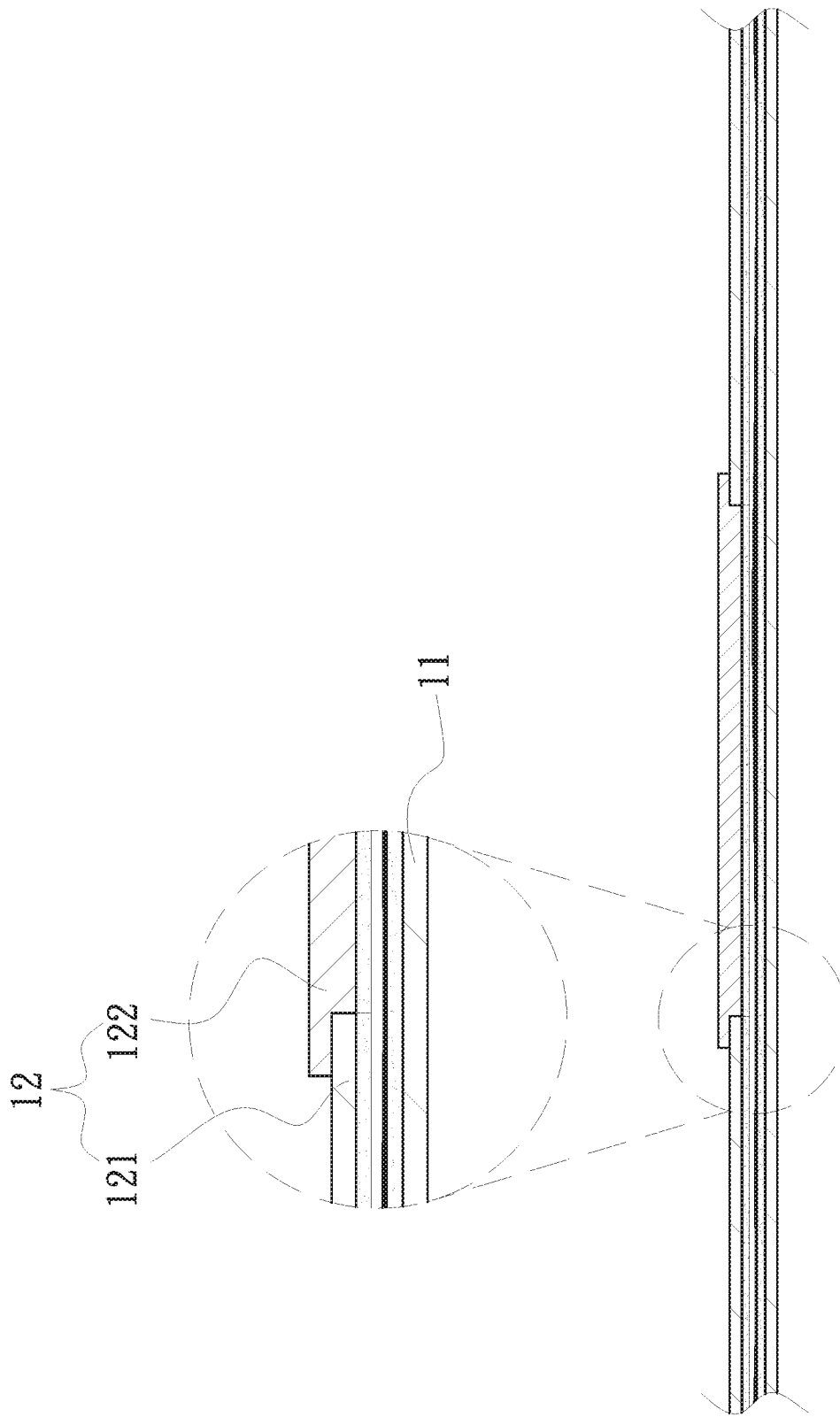
FIG. 3 is a sectional assembled view of a second embodiment of the bendable vapor chamber structure of the present invention.

Please refer to FIG. 3, which is a sectional assembled view of a second embodiment of the bendable vapor chamber structure of the present invention. The second embodiment is partially identical to the first embodiment in structure and thus will not be redundantly described hereinafter. The second embodiment is different from the first embodiment in that the first bendable connection body 122 is bridged over the second plate body assembly 12 and disposed on one side of the second plate body assembly 12 distal from the first plate body 11. That is, the first bendable connection body 122 does not face the first face 111 of the first plate body 11.

Figure 4:
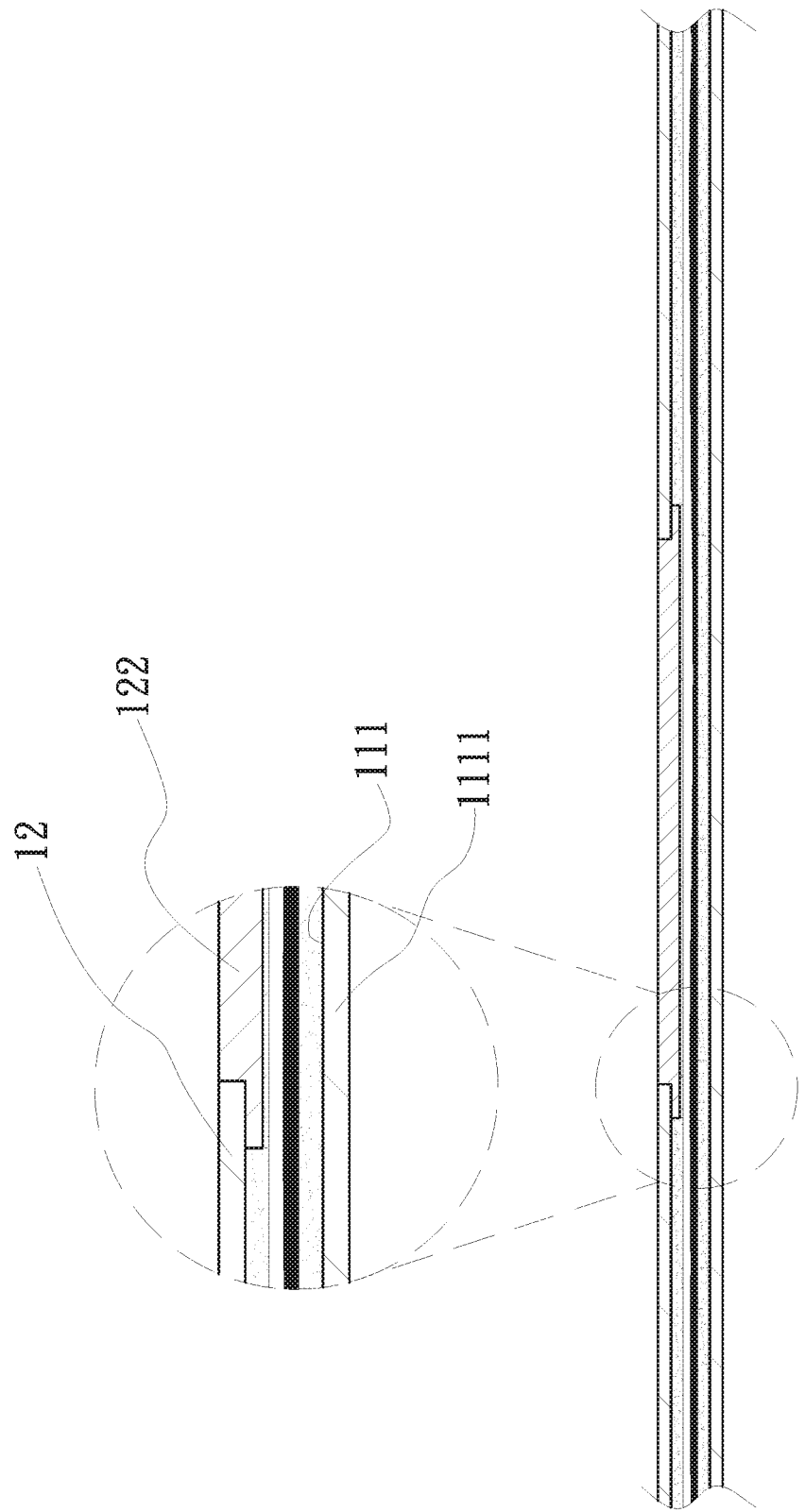
FIG. 4 is a sectional assembled view of a third embodiment of the bendable vapor chamber structure of the present invention.

Please refer to FIG. 4, which is a sectional assembled view of a third embodiment of the bendable vapor chamber structure of the present invention. The third embodiment is partially identical to the first embodiment in structure and thus will not be redundantly described hereinafter. The third embodiment is different from the first embodiment in that the first bendable connection body 122 is bridged over the second plate body assembly 12 and disposed on one side of the second plate body assembly 12 proximal to the first plate body 11. That is, the first bendable connection body 122 faces the first face 111 of the first plate body 11.

Figure 5:
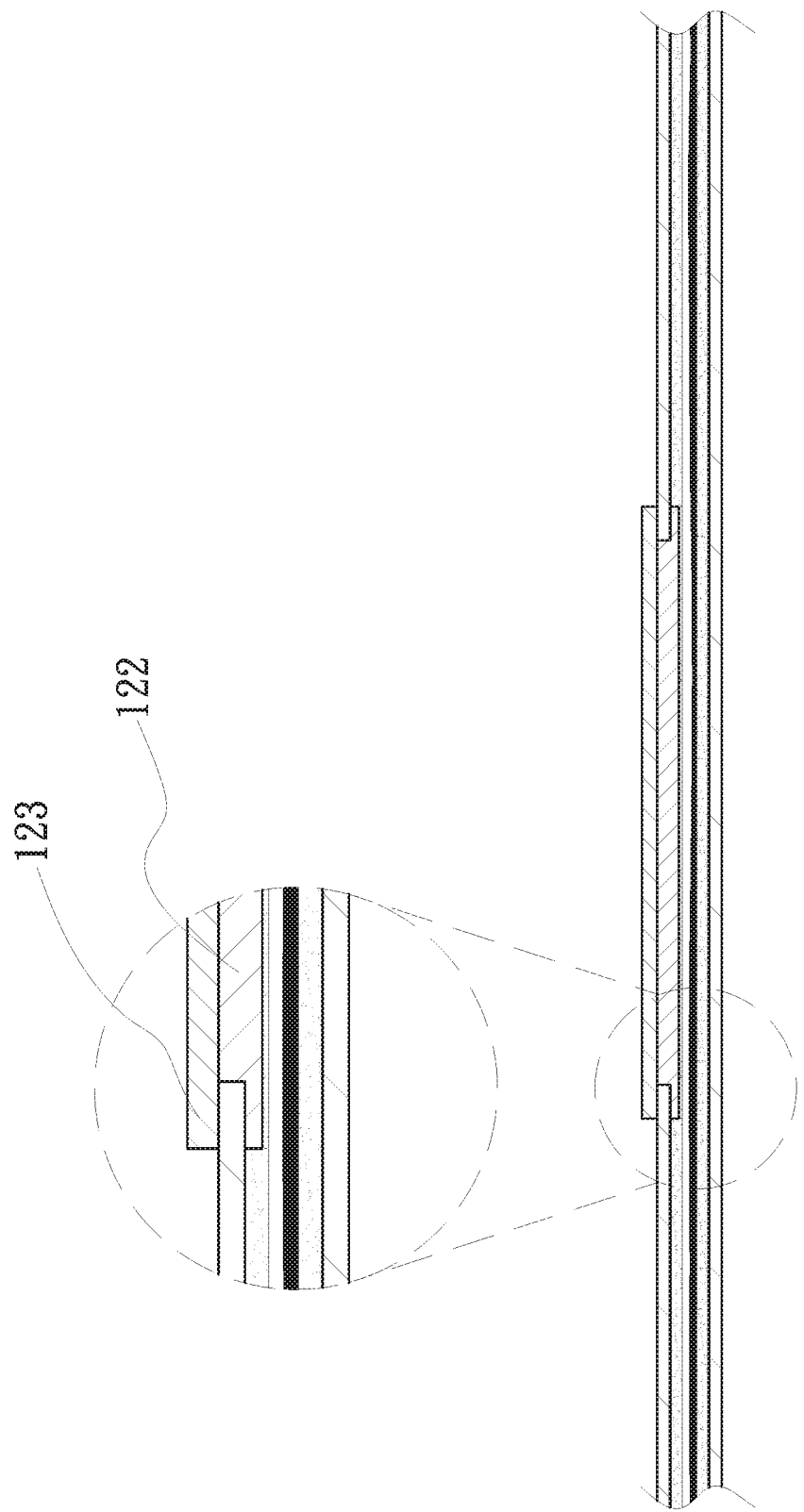
FIG. 5 is a sectional assembled view of a fourth embodiment of the bendable vapor chamber structure of the present invention.

Please refer to FIG. 5, which is a sectional assembled view of a fourth embodiment of the bendable vapor chamber structure of the present invention. The fourth embodiment is partially identical to the third embodiment in structure and thus will not be redundantly described hereinafter. The fourth embodiment is different from the third embodiment in that the first bendable connection body 122 is disposed on one side of the second plate body assembly 12 and a second bendable connection body 123 is disposed on the other side (the opposite side) of the second plate body assembly 12 corresponding to the first bendable connection body 122. That is, the first bendable connection body 122 is disposed on one side of the plate bodies 121 and the second bendable connection body 123 is disposed on the other side of the plate bodies 121 (corresponding to the first bendable connection body 122).

Figure 6:
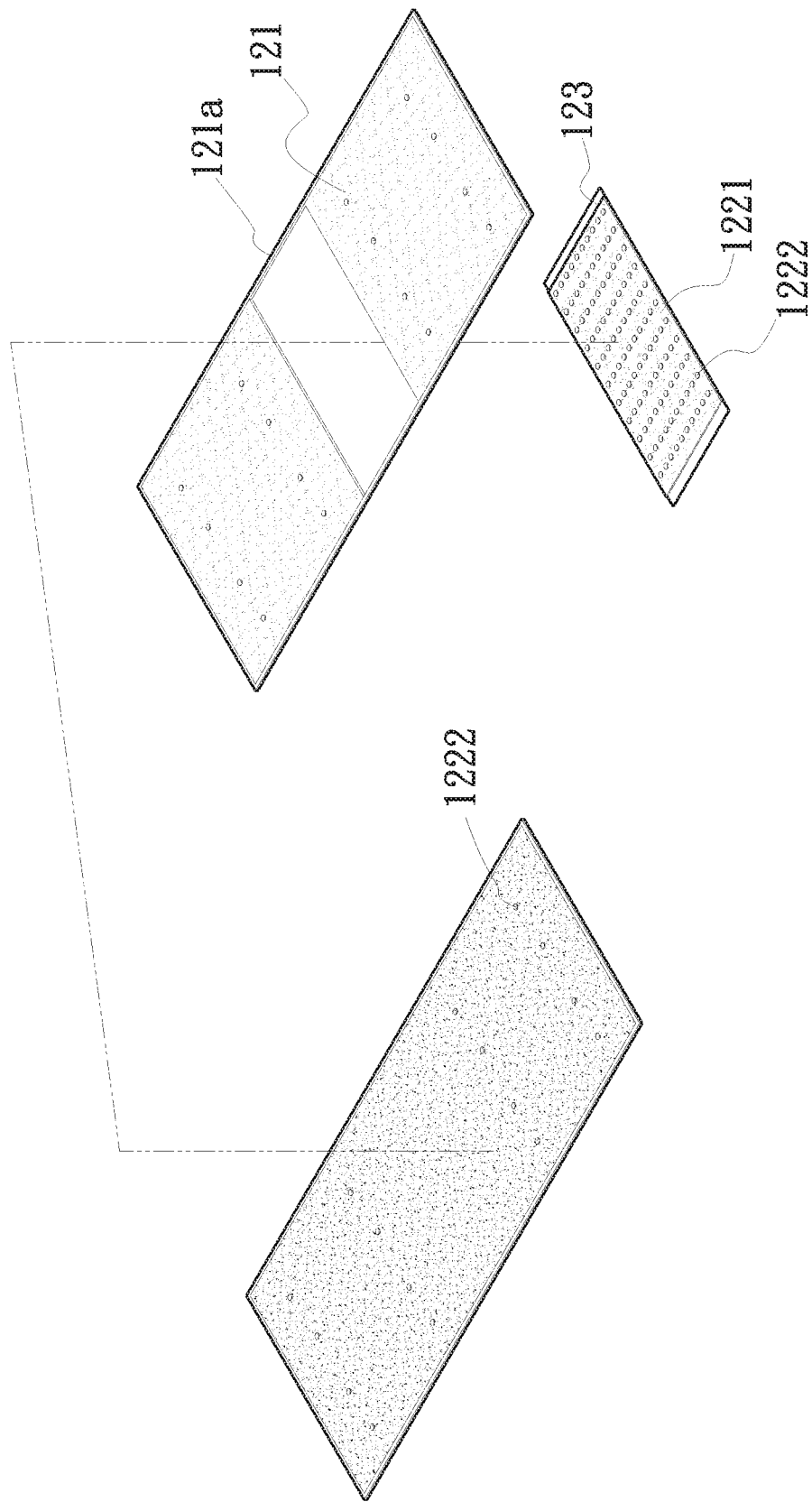
FIG. 6 is a perspective exploded view of a fifth embodiment of the bendable vapor chamber structure of the present invention.

Please refer to FIG. 6, which is a perspective exploded view of a fifth embodiment of the bendable vapor chamber structure of the present invention. The fifth embodiment is partially identical to the first embodiment in structure and thus will not be redundantly described hereinafter. The fifth embodiment is different from the first embodiment in that a connection section 121a is disposed along the outer peripheries of the plate bodies 121 between the plate bodies 121. The connection section 121a is connected with the first bendable connection body 122 to enhance (reinforce) the structural strength of the entire vapor chamber when bent.

In the above first to fifth embodiments, the first and second bendable connection bodies 122, 123 are made of a flexible polymer material selected from a group consisting of polypropylene (PP), polyethylene (PE), polystyrene (PS), polyimide (PI), polyethylene terephthalate (PET), flexible printed circuit (FPC), flexible metal and flexible alloy. In the above embodiments, the first and second bendable connection bodies 122, 123 are, but not limited to, made of flexible printed circuit (FPC) for illustration purposes.

A second capillary structure 1221 is disposed on one side of the first bendable connection body 122 opposite to the first plate body 11. Multiple support structures 1222 are disposed on the first plate body 11 or the second plate body assembly 12 or the first bendable connection body 122.

The first and second capillary structures 1111, 1221 are selected from a group consisting of channeled body, powder sintered body, mesh body, fiber body and waved plate. The support structures 1222 have the form of bosses or raised dots.

The first plate body 11 and the second plate body assembly 12 are made of a material selected from a group consisting of gold, silver, copper, aluminum, iron, stainless steel, titanium, commercial pure titanium, titanium alloy, copper alloy and aluminum alloy. The first plate body 11 and the second plate body assembly 12 can be made of identical material or different materials. The plate bodies 121 of the second plate body assembly 12 can be made of identical material or different materials.

Figure 7:
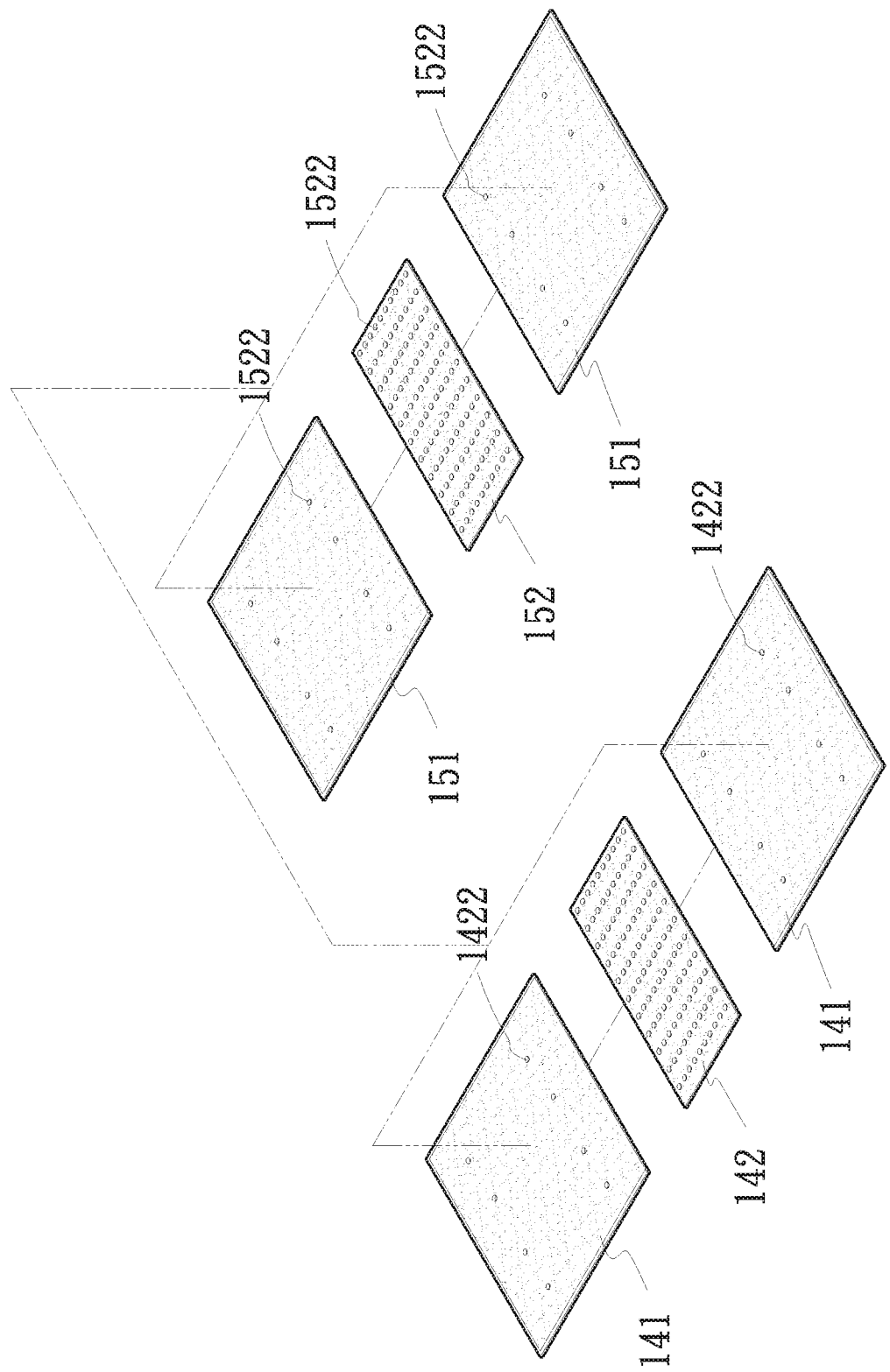
FIG. 7 is a perspective exploded view of a sixth embodiment of the bendable vapor chamber structure of the present invention.
Figure 8:
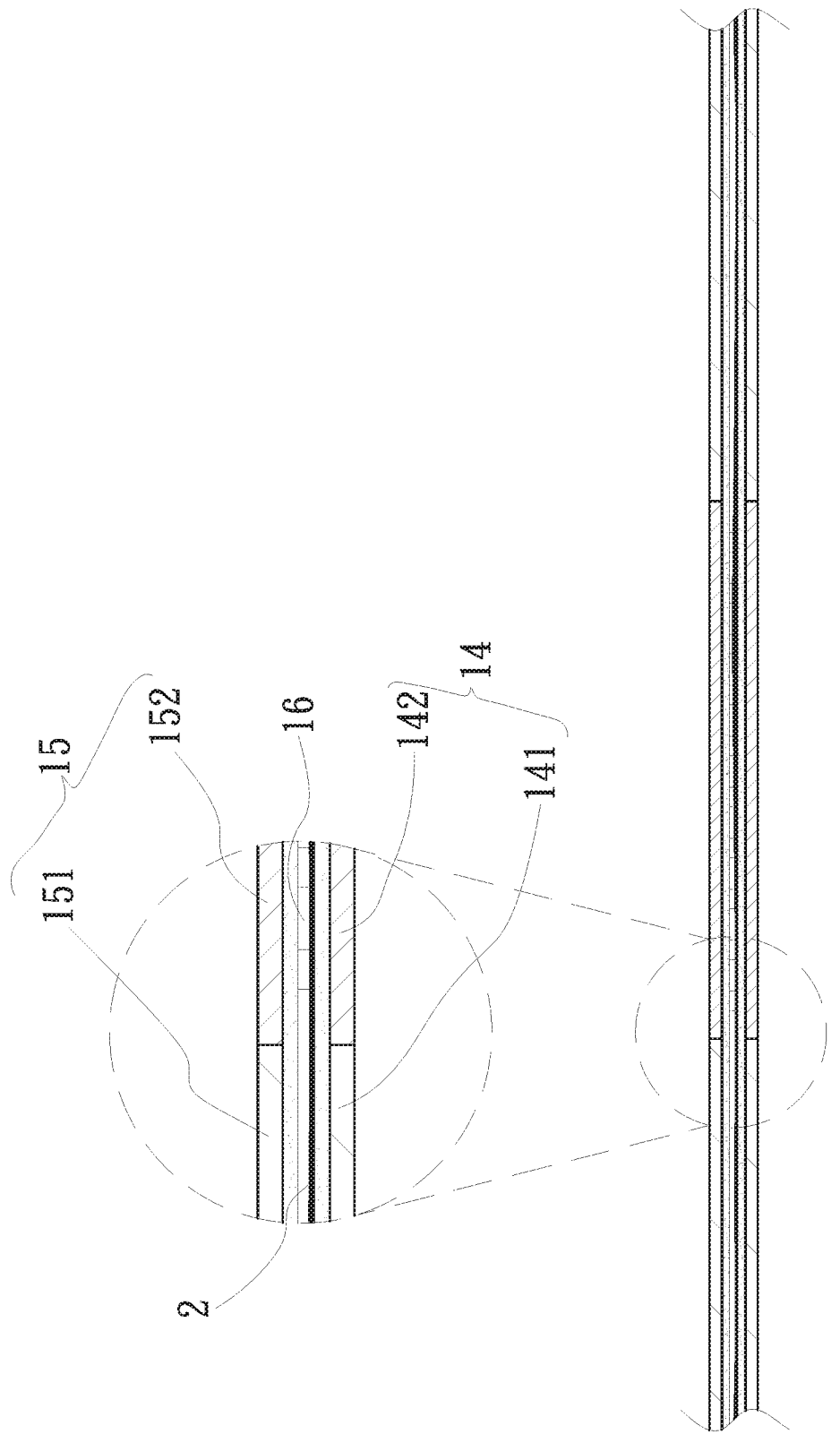
FIG. 8 is a sectional assembled view of the sixth embodiment of the bendable vapor chamber structure of the present invention.

Please refer to FIGS. 7 and 8. FIG. 7 is a perspective exploded view of a sixth embodiment of the bendable vapor chamber structure of the present invention. FIG. 8 is a sectional assembled view of the sixth embodiment of the bendable vapor chamber structure of the present invention. According to the sixth embodiment, the bendable vapor chamber structure of the present invention includes a first plate body assembly 14 and a second plate body assembly 15.

The first plate body assembly 14 has multiple first plate bodies 141 and at least one first bendable connection body 142. The first plate bodies 141 are connected with each other by means of the first bendable connection body 142.

The second plate body assembly 15 has multiple second plate bodies 151 and at least one second bendable connection body 152. The second plate bodies 151 are horizontally connected with each other by means of the second bendable connection body 152. The second plate body assembly and the first plate body assembly 14 are correspondingly mated with each other to together define a receiving space 16. A first capillary structure 1411 is disposed in the receiving space 16. A working liquid 2 is filled in the receiving space 16. The first capillary structure 1411 is selectively disposed on the surface of the first plate body assembly 14 or the surface of the second plate body assembly 15 or disposed on both the surfaces of the first plate body assembly 14 and the second plate body assembly 15.

Figure 9:
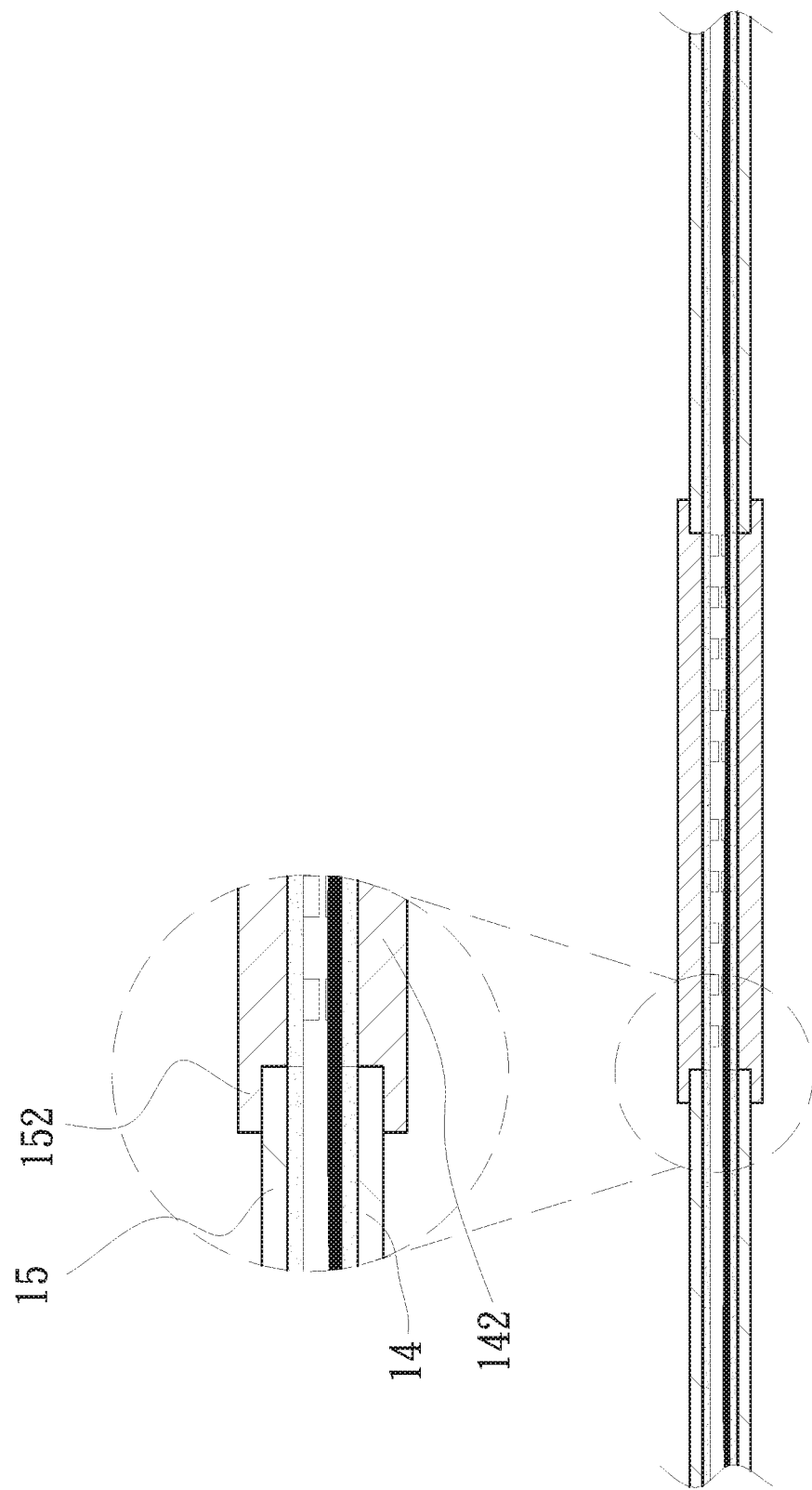
FIG. 9 is a sectional assembled view of a seventh embodiment of the bendable vapor chamber structure of the present invention.

Please refer to FIG. 9, which is a sectional assembled view of a seventh embodiment of the bendable vapor chamber structure of the present invention. The seventh embodiment is partially identical to the sixth embodiment in structure and thus will not be redundantly described hereinafter. The seventh embodiment is different from the sixth embodiment in that the first bendable connection body 142 is disposed on one side of the first plate body assembly 14 distal from the second plate body assembly 15 and the second bendable connection body 152 is disposed on one side of the second plate body assembly 15 distal from the first plate body assembly 14.

Figure 10:
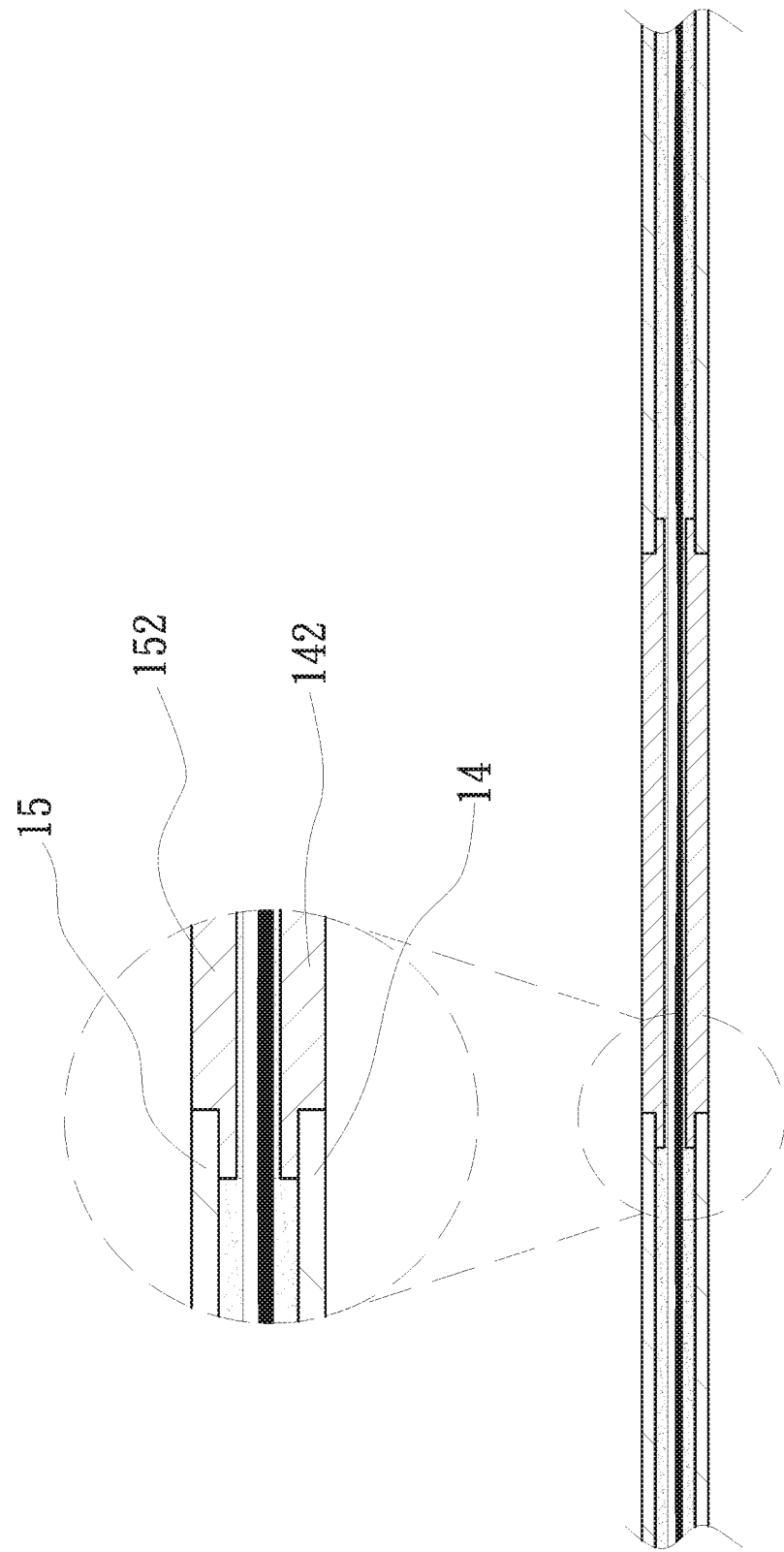
FIG. 10 is a sectional assembled view of an eighth embodiment of the bendable vapor chamber structure of the present invention.

Please refer to FIG. 10, which is a sectional assembled view of an eighth embodiment of the bendable vapor chamber structure of the present invention. The eighth embodiment is partially identical to the sixth embodiment in structure and thus will not be redundantly described hereinafter. The eighth embodiment is different from the sixth embodiment in that the second bendable connection body 152 is disposed on one side of the second plate body assembly 15 proximal to the first plate body assembly 14 and the first bendable connection body 142 is disposed on one side of the first plate body assembly 14 proximal to the second plate body assembly 15.

Figure 11:
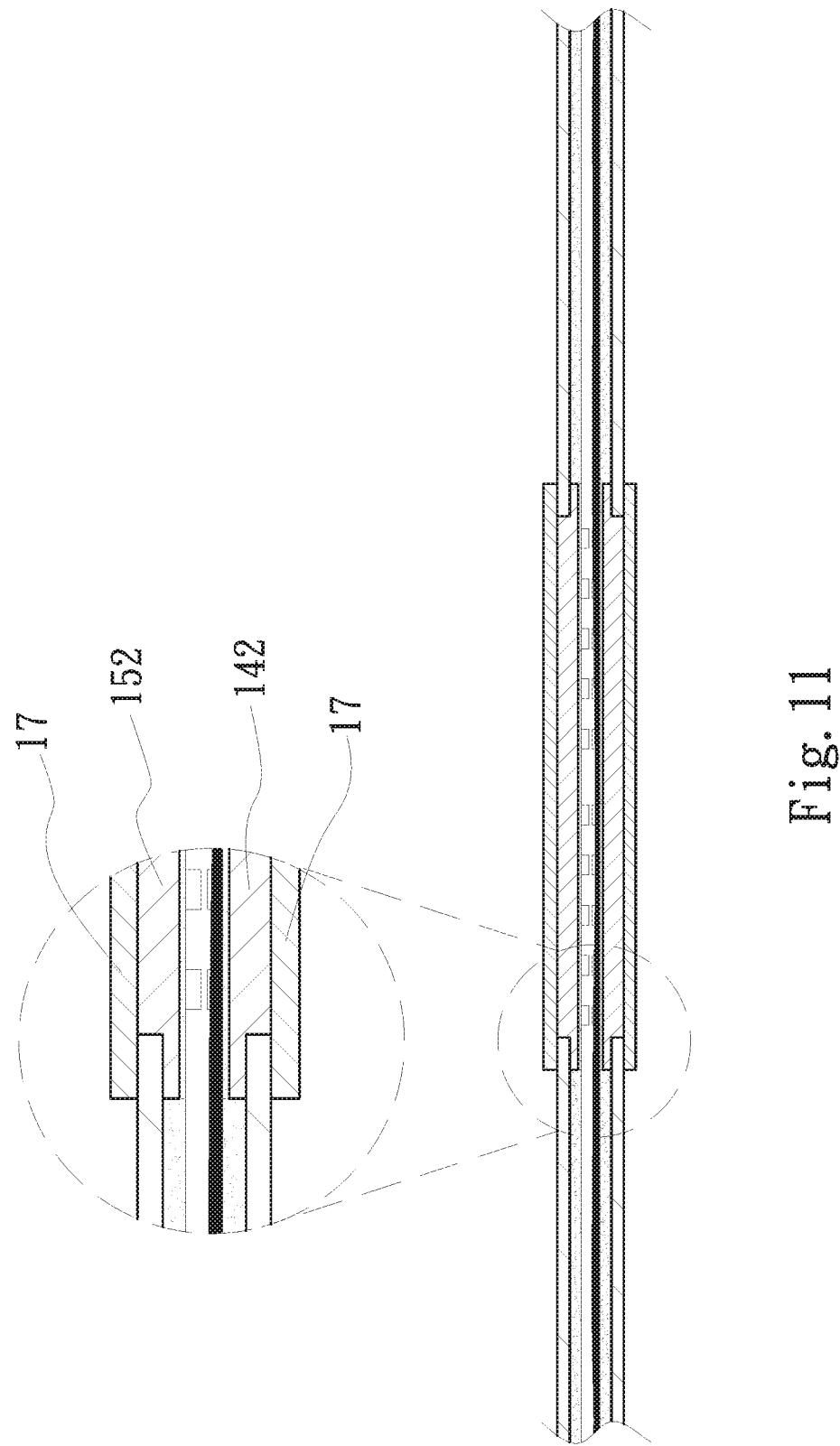
FIG. 11 is a sectional assembled view of a ninth embodiment of the bendable vapor chamber structure of the present invention.

Please refer to FIG. 11, which is a sectional assembled view of a ninth embodiment of the bendable vapor chamber structure of the present invention. The ninth embodiment is partially identical to the sixth embodiment in structure and thus will not be redundantly described hereinafter. The ninth embodiment is different from the sixth embodiment in that the first and second bendable connection bodies 142, 152 are respectively disposed on one side of the first plate body assembly 14 and one side of the second plate body assembly 15 and two third bendable connection bodies 17 are respectively disposed on the other opposite side of the first plate body assembly 14 and the other opposite side of the second plate body assembly 15 corresponding to the first and second bendable connection bodies 142, 152.

Figure 12:
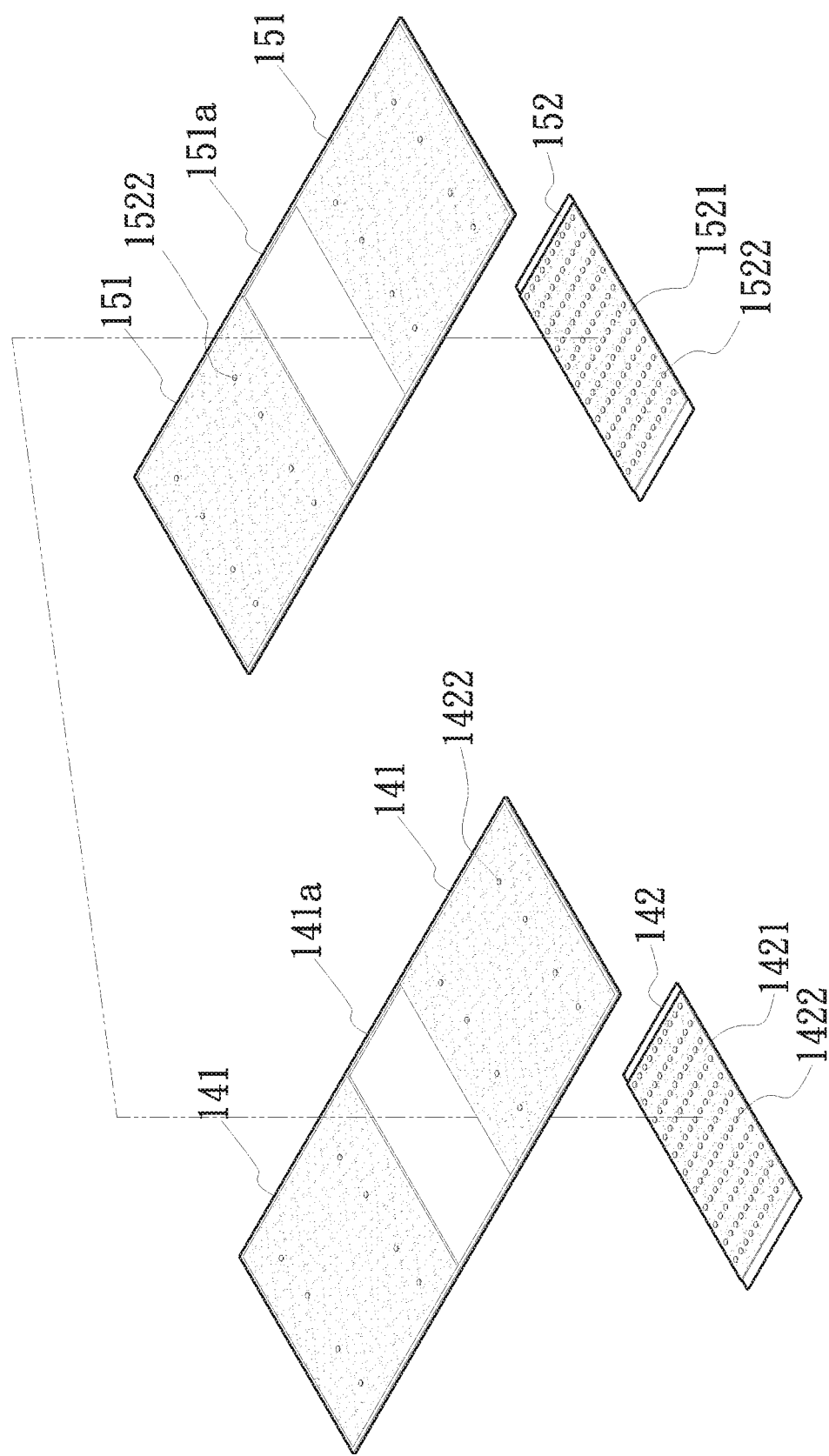
FIG. 12 is a perspective exploded view of a tenth embodiment of the bendable vapor chamber structure of the present invention.

Please refer to FIG. 12, which is a perspective exploded view of a tenth embodiment of the bendable vapor chamber structure of the present invention. The tenth embodiment is partially identical to the sixth embodiment in structure and thus will not be redundantly described hereinafter. The tenth embodiment is different from the sixth embodiment in that multiple first connection sections 141a are disposed along the outer peripheries of the first plate bodies 141 and multiple second connection sections 151a are disposed along the outer peripheries of the second plate bodies 151. The first connection sections 141a are connected with the first bendable connection body 142. The second connection sections 151a are connected with the second bendable connection body 152. The first and second connection sections 141a, 151a serve to enhance the structural strength of the entire vapor chamber when bent.

In the above sixth to tenth embodiments, the first, second and third bendable connection bodies 143, 153, 17 are made of a flexible polymer material selected from a group consisting of polypropylene (PP), polyethylene (PE), polystyrene (PS), polyimide (PI), polyethylene terephthalate (PET), flexible printed circuit (FPC), flexible metal and flexible alloy. In the above embodiments, the first, second and third bendable connection bodies 143, 153, 17 are, but not limited to, made of flexible printed circuit (FPC) for illustration purposes. The first plate body assembly 14 and the second plate body assembly 15 are made of a material selected from a group consisting of gold, silver, copper, aluminum, iron, stainless steel, titanium, commercial pure titanium, titanium alloy, copper alloy and aluminum alloy. The first plate body assembly 14 and the second plate body assembly 15 can be made of identical material or different materials. The first plate bodies 141 of the first plate body assembly 14 can be made of identical material or different materials. The second plate bodies 151 of the second plate body assembly can be made of identical material or different materials.

A second capillary structure 1421 and multiple support structures 1422 are disposed on one side of the first bendable connection body 142 opposite to the second plate body assembly 15.

A third capillary structure 1521 is disposed on one side of the second bendable connection body 152 opposite to the first plate body assembly 14. Multiple support structures 1522 are disposed on the surface of the first plate body assembly 14, the surface of the second plate body assembly 15 and the surfaces of the first and second bendable connection bodies 142, 152.

The first, second and third capillary structures 1411, 1421, 1521 are selected from a group consisting of channeled body, powder sintered body, mesh body, fiber body and waved plate. The support structures 1422, 1522 have the form of bosses or raised dots.

The first, second and third bendable connection bodies 142, 152, 17 are transparent or nontransparent.

The first, second and third capillary structures 1411, 1421, 1521 are formed by means of printing, etching, electroplating or mechanical processing (punching, laser sculpturing, in-mold injection).

Figure 13:
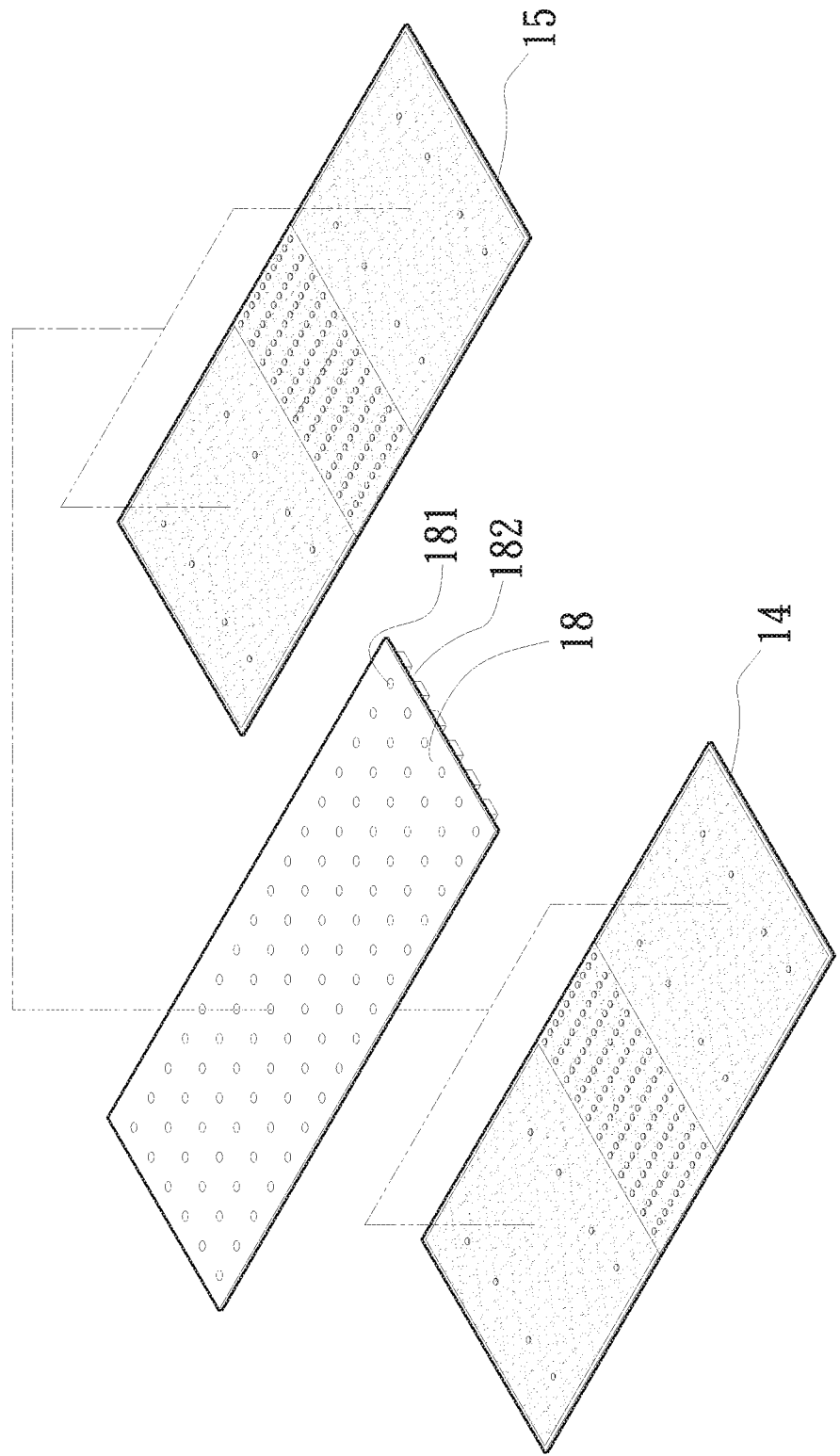
FIG. 13 is a perspective exploded view of an eleventh embodiment of the bendable vapor chamber structure of the present invention.
Figure 14:
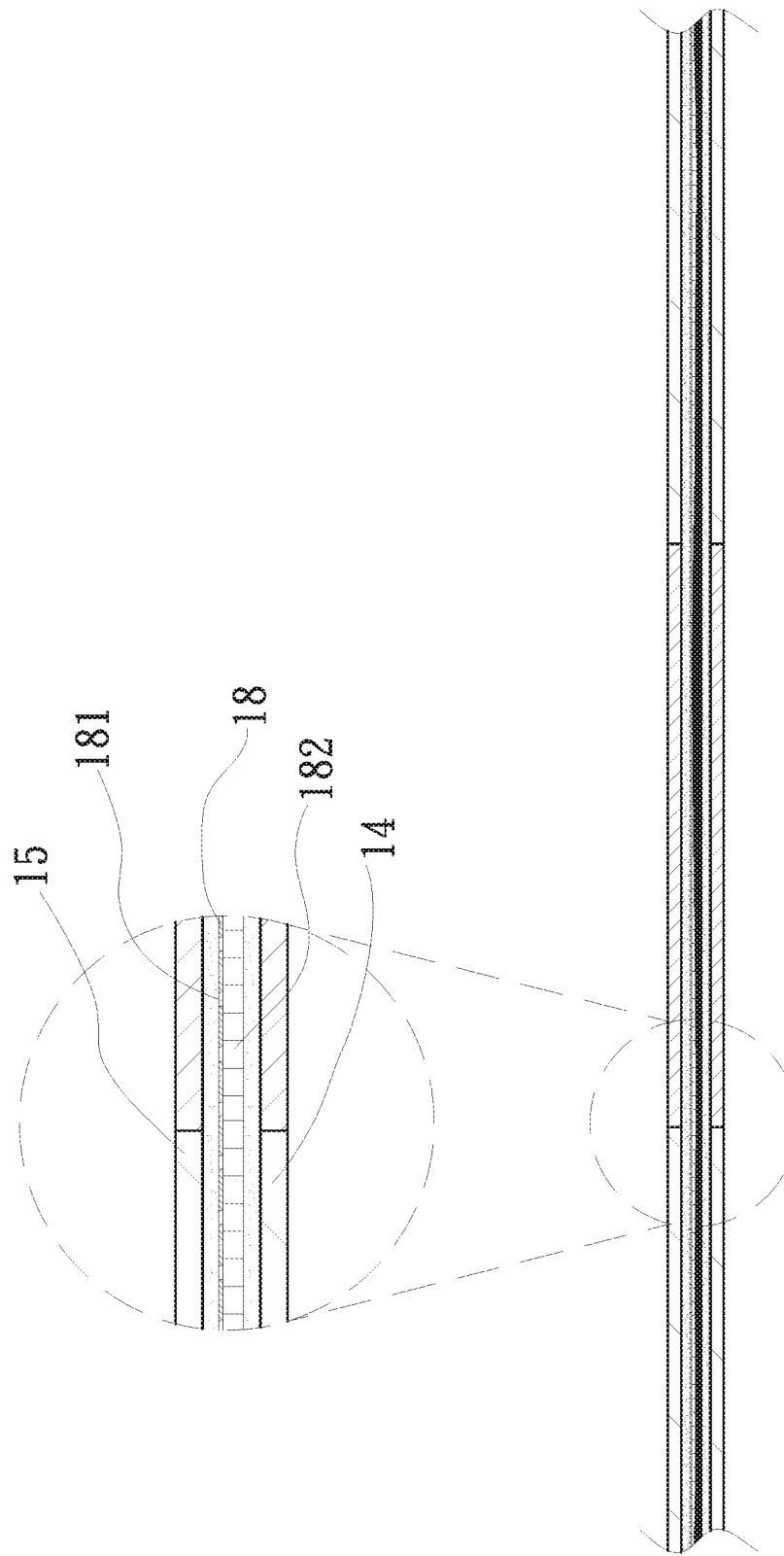
FIG. 14 is a sectional assembled view of the eleventh embodiment of the bendable vapor chamber structure of the present invention.

Please refer to FIGS. 13 and 14. FIG. 13 is a perspective exploded view of an eleventh embodiment of the bendable vapor chamber structure of the present invention. FIG. 14 is a sectional assembled view of the eleventh embodiment of the bendable vapor chamber structure of the present invention. The eleventh embodiment is partially identical to the sixth embodiment in structure and thus will not be redundantly described hereinafter. The eleventh embodiment is different from the sixth embodiment in that a middle layer 18 is disposed between the first plate body assembly 14 and the second plate body assembly 15. In this embodiment, the middle layer 18 is sandwiched between the first and second plate body assemblies 14, 15. That is, after the first and second plate body assemblies 14, 15 are mated with each other to form the receiving space 16 (as shown in FIG. 8), the middle layer 18 is filled in the receiving space 16. The middle layer 18 is a plate body with multiple perforations 181. One side of the middle layer 18 is formed with channels 182 as capillary structure.

Please now refer to FIGS. 15 and 16. FIG. 15 is a perspective view showing the operation of the bendable vapor chamber structure of the present invention. FIG. 16 is a perspective view showing the operation of the bendable vapor chamber structure of the present invention. Also referring to the description of the above first to eleventh embodiments and FIGS. 1 to 14, the bendable vapor chamber structure of the present invention is mainly for solving the problem of the conventional vapor chamber or heat pipe, which cannot be bent or folded onto itself. As aforesaid, the first embodiment of the present invention employs at least three metal plate bodies, which are assembled with each other. The plate bodies 121 of the second plate body assembly 12 are connected by means of the first bendable connection body 122 (made of flexible polymer material). Then the second plate body assembly 12 and the first plate body 11 are correspondingly mated with each other and the periphery is sealed. Then the working liquid is filled and then the vapor chamber is vacuumed. Finally, the vapor chamber is sealed. The first plate body 11 is quite thin so that it can be bent and folded onto itself. With respect to the second plate body assembly 12, by means of the arrangement of the first bendable connection body 122, the second plate body assembly 12 is also bendable. Therefore, the first embodiment of the bendable vapor chamber structure of the present invention can be bent and folded onto itself.

In the sixth embodiment of the present invention, four metal plate bodies are assembled with each other. The first plate bodies 141 of the first plate body assembly 14 are connected by means of the first bendable connection body 142, while the second plate bodies 151 of the second plate body assembly 15 are connected by means of the second bendable connection body 152. Then the first plate body assembly 14 and the second plate body assembly 15 are correspondingly mated with each other and the periphery is sealed. Then the working liquid is filled and then the vapor chamber is vacuumed. Finally, the vapor chamber is sealed. Accordingly, by means of the first and second bendable connection bodies 142, 152, the bendable vapor chamber structure of the present invention can be bent and folded onto itself or unfolded.

The bendable vapor chamber structure of the present invention can solve the problem of the conventional thin vapor chamber or thin heat pipe, which cannot be bent or horizontally folded onto itself. The bendable vapor chamber structure of the present invention is applicable to a handheld device, which needs to be bent and folded onto itself or unfolded without the limitation of bending and folding.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A bendable vapor chamber structure comprising:
a first plate body having a first face and a second face on upper and lower sides;
a second plate body assembly having multiple second plate bodies and at least one first bendable connection body disposed between and connected with the second plate bodies so as to allow the first plate body and the second plate body assembly to be repeatedly folded upon themselves to form a contained angle between zero and 180 degrees and to be repeatedly unfolded from each other, wherein the second plate body assembly is correspondingly mated with the first plate body to together define a receiving space, wherein the receiving space corresponding to the at least one first bendable connection body, between the multiple second plate bodies, is configured to be free of support structure;
a first capillary structure disposed in the receiving space; and
a working liquid being filled in the receiving space.

2. The bendable vapor chamber structure as claimed in claim 1, wherein the first bendable connection body is made of a flexible polymer material selected from a group consisting of polypropylene (PP), polyethylene (PE), polystyrene (PS), polyimide (PI), polyethylene terephthalate (PET) and flexible printed circuit (FPC).

3. The bendable vapor chamber structure as claimed in claim 1, wherein a second capillary structure is disposed on one side of the first bendable connection body opposite to the first plate body, the first and second capillary structures being selected from a group consisting of channeled body, powder sintered body, mesh body, fiber body, and waved plate.

4. The bendable vapor chamber structure as claimed in claim 1, wherein the first plate body and the second plate body assembly are made of a material selected from a group consisting of gold, silver, copper, aluminum, iron, stainless steel, titanium, commercial pure titanium, titanium alloy, copper alloy and aluminum alloy, the first plate body and the second plate body assembly being made of identical material or different materials, the second plate bodies of the second plate body assembly being made of identical material or different materials.

5. The bendable vapor chamber structure as claimed in claim 1, wherein the first bendable connection body is disposed on one side of the second plate bodies distal from the first plate body or proximal to the first plate body.

6. The bendable vapor chamber structure as claimed in claim 5, wherein a second bendable connection body is disposed on the other side of the second plate bodies opposite to the first bendable connection body.

7. The bendable vapor chamber structure of claim 6, wherein the first and second bendable connection bodies are connected to the second plate bodies so as to bridge over and to bridge under the second plate bodies.

8. The bendable vapor chamber structure as claimed in claim 1, wherein a connection section is disposed along outer peripheries of the plate bodies, the connection section being connected with the first bendable connection body.

9. The bendable vapor chamber structure as claimed in claim 1, wherein the first capillary structure is selectively disposed on a surface of the first plate body or a surface of the second plate body assembly.

10. A bendable vapor chamber structure comprising:
a first plate body assembly having multiple first plate bodies and at least one first bendable connection body connecting the first plate bodies;
a second plate body assembly having multiple second plate bodies and at least one second bendable connection body connecting the second plate bodies, the second plate body assembly being correspondingly mated with the first plate body assembly to together define a receiving space and such that the first and second bendable connection bodies allow the first and second plate body assemblies to be repeatedly folded upon themselves to form a contained angle between zero and 180 degrees and to be repeatedly unfolded from each other and such that the receiving space corresponding to the first and second bendable connection bodies, between the multiple plate bodies, is configured to be free of support structure, a first capillary structure disposed in the receiving space, and a working liquid being filled in the receiving space.

11. The bendable vapor chamber structure as claimed in claim 10, wherein the first and second bendable connection bodies are made of a flexible polymer material selected from a group consisting of polypropylene (PP), polyethylene (PE), polystyrene (PS), polyimide (PI), polyethylene terephthalate (PET) and flexible printed circuit (FPC).

12. The bendable vapor chamber structure as claimed in claim 10, wherein the first plate body assembly and the second plate body assembly are made of a material selected from a group consisting of gold, silver, copper, aluminum, iron, stainless steel, titanium, commercial pure titanium, titanium alloy, copper alloy and aluminum alloy, the first plate body assembly and the second plate body assembly being made of identical material or different materials, the first plate bodies of the first plate body assembly being made of identical material or different materials, the second plate bodies of the second plate body assembly being made of identical material or different materials.

13. The bendable vapor chamber structure as claimed in claim 10, wherein a second capillary structure is disposed on one side of the first bendable connection body opposite to the second plate body assembly, the second capillary structure being selected from a group consisting of channeled body, powder sintered body, mesh body, fiber body, and waved plate.

14. The bendable vapor chamber structure as claimed in claim 13, wherein a third capillary structure is disposed on one side of the second bendable connection body opposite to the first plate body assembly, the third capillary structure being selected from a group consisting of channeled body, powder sintered body, mesh body, fiber body and waved plate, the first, second and third capillary structures being formed by means of printing, etching, electroplating or mechanical processing (punching, laser sculpturing, in-mold injection).

15. The bendable vapor chamber structure as claimed in claim 10, wherein the first bendable connection body is disposed on one side of the first plate body assembly distal from the second plate body assembly or proximal to the second plate body assembly, the second bendable connection body being disposed on one side of the second plate body assembly distal from the first plate body assembly or proximal to the first plate body assembly.

16. The bendable vapor chamber structure as claimed in claim 10, wherein the first and second bendable connection bodies are respectively disposed on one side of the first plate body assembly and one side of the second plate body assembly and two third bendable connection bodies are respectively disposed on the other opposite side of the first plate body assembly and the other opposite side of the second plate body assembly, the first, second and third bendable connection bodies being transparent or nontransparent.

17. The bendable vapor chamber structure as claimed in claim 10, wherein multiple first connection sections are disposed along outer peripheries of the first plate bodies between the first plate bodies, multiple second connection sections being disposed along outer peripheries of the second plate bodies between the second plate bodies, the first connection sections being connected with the first bendable connection body, the second connection sections being connected with the second bendable connection body.

18. The bendable vapor chamber structure as claimed in claim 10, wherein a middle layer is disposed between the first and second plate body assemblies.

19. The bendable vapor chamber structure as claimed in claim 10, wherein the first capillary structure is selectively disposed on a surface of the first plate body assembly or a surface of the second plate body assembly.

20. The bendable vapor chamber structure of claim 10, wherein each bendable connection body is connected to the respective plate bodies so as to bridge over or to bridge under the respective plate bodies.

\* \* \* \* \*